US010191106B2

(12) United States Patent
Pu et al.

(10) Patent No.: US 10,191,106 B2
(45) Date of Patent: Jan. 29, 2019

(54) TECHNIQUES TO IDENTIFY A PROCESS CORNER

(71) Applicant: QUALCOMM Incorporated, San Diego, CA (US)

(72) Inventors: Yu Pu, San Diego, CA (US); Giby Samson, San Diego, CA (US); Kendrick Hoy Leong Yuen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 433 days.

(21) Appl. No.: 15/015,547

(22) Filed: Feb. 4, 2016

(65) Prior Publication Data

US 2017/0089974 A1    Mar. 30, 2017

Related U.S. Application Data

(60) Provisional application No. 62/232,486, filed on Sep. 25, 2015.

(51) Int. Cl.
*G01R 31/02* (2006.01)
*G01R 31/28* (2006.01)
(Continued)

(52) U.S. Cl.
CPC ..... *G01R 31/2851* (2013.01); *G01R 31/2884* (2013.01); *G01R 31/3004* (2013.01); *H01L 22/14* (2013.01); *H01L 22/34* (2013.01)

(58) Field of Classification Search
CPC . G01R 31/28; G01R 31/2851; G06F 17/5081; G06F 17/505; G11C 5/14;
(Continued)

(56) References Cited

U.S. PATENT DOCUMENTS 5,631,596 A    5/1997 Sporck et al.
5,686,855 A    11/1997 Lee
(Continued)

OTHER PUBLICATIONS

International Search Report and Written Opinion—PCT/US2016/049028—ISA/EPO—dated Dec. 20, 2016.

*Primary Examiner* — Thang Le
(74) *Attorney, Agent, or Firm* — Muncy, Geissler, Olds & Lowe, P.C.

(57) ABSTRACT

Methods and apparatus for identifying a process corner are provided. Provided is an exemplary method for identifying a process corner of an integrated circuit (IC). The IC has a first asymmetrical ring oscillator (ARO1) including pull-up transistors that have a low threshold voltage (LVT) and pull-down transistors that have a regular threshold voltage (RVT), and has a second asymmetrical ring oscillator (ARO2) including pull-up transistors that have an RVT and pull-down transistors having an LVT. The exemplary method includes applying an ultra-low power supply voltage to the ARO1 and the ARO2 that causes the integrated circuit to operate near a verge of malfunction, measuring an output frequency of the ARO1, measuring an output frequency of the ARO2, calculating a calculated ratio of the output frequency of the ARO1 and the output frequency of the ARO2, and comparing the calculated ratio to a fiduciary ratio to identify the process corner.

25 Claims, 7 Drawing Sheets

(51) Int. Cl.
*G01R 31/30* (2006.01)
*H01L 21/66* (2006.01)

(58) Field of Classification Search
CPC ......... G11C 29/04; G11C 11/417; G05F 1/10; G05F 1/56; G05F 3/16; H03K 19/0963
See application file for complete search history.

(56) References Cited

U.S. PATENT DOCUMENTS

| | | |
|---|---|---|
| 6,894,528 B2 | 5/2005 | Gauthier et al. |
| 7,330,080 B1 | 2/2008 | Stoiber et al. |
| 7,627,839 B1 | 12/2009 | Chan |
| 8,386,988 B2 | 2/2013 | Nomura |
| 8,801,281 B1 | 8/2014 | Chan et al. |
| 8,976,574 B2 * | 3/2015 | Ahmed .................. G11C 29/50 365/154 |
| 9,112,484 B1 * | 8/2015 | Clark ................... H03K 3/0315 |
| 9,473,154 B2 * | 10/2016 | Kim ....................... H02M 3/04 |
| 2004/0051562 A1 * | 3/2004 | Gauthier ............ H03K 19/0963 326/98 |
| 2009/0027131 A1 * | 1/2009 | Suzuki ............... G01R 31/2831 331/57 |
| 2012/0051395 A1 * | 3/2012 | Chen ........................ G01K 7/01 374/142 |
| 2012/0139624 A1 * | 6/2012 | Senthinathan ........ G06F 1/3243 327/540 |
| 2012/0161885 A1 | 6/2012 | Saneyoshi et al. |
| 2013/0232347 A1 | 9/2013 | Pinto et al. |

\* cited by examiner

Simulation result of 15-stage RO in process at 25°C

| VDD (V) | 0.2 | 0.3 | 0.4 | 0.5 | 0.8 | 1.0 |
|---|---|---|---|---|---|---|
| RVT device | 0.160 mhz | 1.368 mhz | 11.270 mhz | 70.285 mhz | 1505.775 mhz | 3542.050 mhz |
| LVT device | 1.615 mhz | 12.103 mhz | 74.851 mhz | 306.515 mhz | 2840.010 mhz | 5196.175 mhz |
| LVT device + Forward body bias | 4.282 mhz | 28.505 mhz | 147.280 mhz | 502.350 mhz | 3380.750 mhz | 5708.150 mhz |
| | 27X | 21X | 13X | 7.1X | 2.2X | 1.6X |

Simulation results @ 350mV VDD, Temp=25C

|      | RO (RVT)   | ARO1       | ARO2       | $f(ARO1)/f(ARO2)$ |
|------|------------|------------|------------|-------------------|
| TT   | 3.995 MHz  | 11.828 MHz | 10.094 MHz | 1.17              |
| SS   | 0.505 MHz  | 1.762 MHz  | 1.181 MHz  | 1.49              |
| FF   | 30.656 MHz | 82.188 MHz | 75.318 MHz | 1.09              |
| FS   | 1.811 MHz  | 15.191 MHz | 4.998 MHz  | 3.04              |
| SF   | 3.105 MHz  | 5.816 MHz  | 20.167 MHz | 0.29              |

Absolutely RO frequency indicates TT/SS/FF

Frequency ratio between ARO1 and ARO2 indicates FS/SF

FIG. 5

TECHNIQUES TO IDENTIFY A PROCESS CORNER

PRIORITY CLAIM UNDER 35 U.S.C. § 119

Pursuant to 35 U.S.C. § 119, the present application claims priority to U.S. Provisional Patent Application Ser. No. 62/232,486, entitled "TECHNIQUES TO IDENTIFY A PROCESS CORNER," filed Sep. 25, 2015, which is hereby incorporated by reference in its entirety.

FIELD OF THE DISCLOSURE

This disclosure relates generally to electronics, and more specifically, but not exclusively, to methods, and apparatuses that identify a process corner of circuits on an Integrated Circuit Wafer.

INTRODUCTION

Consumers demand electronic devices that have a long battery life. Battery life can be increased by implementing a lower operating voltage. Power consumption of an integrated circuit can be reduced by reducing the integrated circuit's operating voltage. If the integrated circuit's operating voltage is reduced to a value that is too low, then the integrated circuit will malfunction. Thus, the integrated circuit's minimum operating voltage is limited to a value at which the integrated circuit can function. Under ideal conditions, when multiple copies of the integrated circuit are fabricated, each of the integrated circuits would have the same minimum operating voltage. However, in practice, then multiple integrated circuits are fabricated, each circuit varies slightly from the others due to naturally-occurring variations in internal features of each respective integrated circuit. Some of the variations can include variations in dopant concentration in a region, variations in structure dimensions (e.g., width, length, layer thickness, and the like), and the like. Thus, a specific integrated circuit's respective minimum operating voltage at which the specific integrated circuit can function can be different from that of a different integrated circuit in the same fabrication batch. Accordingly, a functioning yield for a specific fabrication batch can vary for different minimum operating voltages.

To optimize the functioning yield, process corners are determined. Process corners are the extreme extents of minimum required operating values at which an integrated circuit may not function. The operating values can include process (P), voltage (V) (e.g., operating voltage), and temperature (T), also known by their initials—"PVT". Plots of the process corners can be combined and graphed as a geometric shape. Any integrated circuit operating with operating values that are within the confines of that geometric shape should function.

Process corners are referred to using two letters. The first letter refers to an N-channel metal-oxide-silicon field effect transistor (NMOS) corner, and the second letter refers to a P-channel metal-oxide-silicon field effect transistor (PMOS) corner (e.g., (NP)). Either of the two letters can refer to a typical corner (T), a fast corner (F), or a slow corner (S). Thus, there are five corners in two groups. The first group has symmetrical corners, in which NMOS and PMOS transistors act in a similar manner when operating values are varied (e.g., substantially to an extreme value). The first group includes typical-typical (TT), fast-fast (FF), and slow-slow (SS). The second group has asymmetrical corners, in which NMOS and PMOS transistors do not act in a similar manner when operating values are varied. The second group includes fast-slow (FS) and slow-fast (SF). For example, when operating near, or at, an asymmetrical corner, PMOS transistors in an integrated circuit may switch much faster than complementary NMOS transistors in the same integrated circuit, which leads to unbalanced switching. In an example, the unbalanced switching can inject and propagate incorrect digital logic values into a process performed by the integrated circuit. Also, fast transistors have higher current (active and leakage) than slow transistors. Typically, circuits are designed for optimal performance at a symmetric process corner (e.g. SS or TT). So in a split corner, the current ratio between the NMOS and PMOS transistors is offset from the optimal design parameters and circuit performance is degraded. This is especially important for "ratioed" circuits such as flip-flops and memory bit cells, where the functionality of the design depends on a limited allowable range of current ratios between NMOS and PMOS.

As integrated circuits (ICs) are fabricated with smaller dimensions, the effect of process variation on the transistor characteristics becomes more pronounced and the threshold voltage of individual transistors varies considerably over process corners—even in a single integrated circuit wafer. Process corners represent extremes of parameter variations of ICs within an integrated circuit wafer.

Generally there is a tradeoff in IC devices across a wafer; they can be fast and leaky or slow and less leaky. These characteristics can be adjusted, for example, by body biasing transistors to alter their threshold voltages. Adaptive Body Biasing (ABB) can alter the performance characteristics of ICs on a wafer on an individual IC basis, and thereby reduce device variation and increase usable yield of devices on the wafer.

Therefore, there is a need in the art to be able to detect such process corners in order to compensate for the varied characteristics of ICs within an integrated circuit wafer.

SUMMARY

This summary provides a basic understanding of some aspects of the present teachings. This summary is not exhaustive in detail, and is neither intended to identify all critical features, nor intended to limit the scope of the claims.

Provided are exemplary methods and apparatus for identifying a process corner of an integrated circuit. In an exemplary method, an integrated circuit has a first asymmetrical ring oscillator (ARO1) including pull-up transistors that have a low threshold voltage (LVT) and pull-down transistors that have a regular threshold voltage (RVT), and a second asymmetrical ring oscillator (ARO2) including pull-up transistors that have an RVT and pull-down transistors having an LVT. The exemplary method includes applying an ultra-low power supply voltage to the ARO1 and the ARO2. The applied ultra-low power supply voltage causes the integrated circuit to operate near a verge of malfunction. The method also includes measuring an output frequency of the ARO1, measuring an output frequency of the ARO2, calculating a ratio of the output frequency of the ARO1 and the output frequency of the ARO2, and comparing the calculated ratio to a fiduciary ratio. The fiduciary ratio is of the output frequency of the ARO1 and the output frequency of the ARO2 at a Typical-Typical (TT), Slow-Slow (SS), or Fast-Fast (FF) process corner. If the calculated ratio is more than a first number of times the fiduciary ratio, or less than a second number of times the fiduciary ratio, then the value of the (manufactured) process variation of the integrated circuit and chip is substantially at an asymmetric process corner. In addition, the direction of the asymmetry can be determined. If the calculated ratio is greater than a constant "A" multiplied by the fiduciary ratio, then the asymmetric corner is Fast-Slow (FS) (i.e., n-type field effect transistor (NFET) is fast, p-type field effect transistor (PFET) is slow). If the calculated ratio is less than a constant "B" multiplied by the fiduciary ratio, then the asymmetric corner is Slow-Fast (SF) (i.e., n-type field effect transistor (NFET) is slow; p-type field effect transistor (PFET) is fast). If the calculated ratio does not meet the above test, then the value of the (manufactured) process variation of the integrated circuit and chip is substantially at a symmetric process corner—in this case, we can tell if the process corner is at SS or FF by comparing the ARO1 or ARO2 output frequency with a first threshold frequency, such as a baseline frequency measured for a TT die. If the ARO1 or ARO2 output frequency is less than the first threshold frequency, then the process is more toward SS (e.g., substantially at the SS process corner and thus identified as being substantially at the SS process corner). If the ARO1 or ARO2 output frequency is greater than the first threshold frequency, the process is more toward FF (e.g., the threshold substantially at the FF process corner and thus identified as being substantially at the FF process corner). A ratio of the output frequency of the ARO1 divided by the output frequency of the ARO2 is a digital value, and the fiduciary ratio is a digital value. Optionally, if the integrated circuit further includes a symmetrical ring oscillator (RO) including pull-up transistors that have a regular threshold voltage (RVT) and pull-down transistors that have an RVT, the method can include applying the ultra-low power supply voltage to the RO, measuring an output frequency of the RO, and comparing a value of the output frequency of the RO to a second threshold frequency (e.g., a baseline frequency measured for the TT die). The applied ultra-low power supply voltage causes the integrated circuit to operate near a verge of malfunction. If the absolute RO output frequency is less than the second threshold frequency, then the process more toward SS (e.g., substantially at the SS process corner and thus identified as being substantially at the SS process corner). If the absolute RO output frequency is greater than the second threshold frequency, the process is more toward FF (e.g., substantially at the FF process corner and thus identified as being substantially at the FF process corner). The method can optionally include forming the ARO1 and the ARO2 on a substrate of the integrated circuit. The method can optionally include integrating the integrated circuit into a mobile device, a music player, a video player, an entertainment unit, a navigation device, a communications device, a tablet, a computer, the like, or a combination thereof.

In a further example, provided is a non-transitory computer-readable medium, comprising processor-executable instructions stored thereon that are configured to cause a processor to initiate at least a part of the aforementioned method. The non-transitory computer-readable medium can be integrated with a device, such as a mobile device, a music player, a video player, an entertainment unit, a navigation device, a communications device, a tablet, a computer, the like, or a combination thereof.

In another example, provided is a first apparatus configured to identify a process corner of an integrated circuit. The first apparatus includes a first asymmetrical ring oscillator (ARO1) integrated as a part of the integrated circuit. The ARO1 includes pull-up transistors that have a low threshold voltage (LVT) and pull-down transistors that have a regular threshold voltage (RVT). The first apparatus also includes a second asymmetrical ring oscillator (ARO2) integrated as a part of the integrated circuit. The ARO2 includes pull-up transistors that have an RVT and pull-down transistors having an LVT. The first apparatus also includes means for applying an ultra-low power supply voltage to the ARO1 and the ARO2, means for measuring an output frequency of the ARO1, means for measuring an output frequency of the ARO2, means for calculating a calculated ratio of the output frequency of the ARO1 and the output frequency of the ARO2, and means for comparing the calculated ratio to a fiduciary ratio. The applied ultra-low power supply voltage causes the integrated circuit to operate near a verge of malfunction. The fiduciary ratio is of the output frequency of the ARO1 divided by the output frequency of the ARO2 at a TT, SS, or FF process corner. If the calculated ratio is more than a first number of times the fiduciary ratio or less than a second number of times the fiduciary ratio, then the value of the (manufactured) process variation of the integrated circuit and chip is substantially at an asymmetric process corner. If the calculated ratio does not meet the above test, then the value of the (manufactured) process variation of the integrated circuit and chip is substantially at a symmetric process corner. In addition, the first apparatus can include means for determining the direction of the asymmetry that are configured to perform the following steps. If the calculated ratio is greater than a constant "A" multiplied by the fiduciary ratio, then the asymmetric corner is FS (NFET fast, PFET slow). If the calculated ratio is less than a constant "B" multiplied by the fiduciary ratio, then the asymmetric corner is SF (NFET slow, PFET fast). The first apparatus can include means for determining the direction of the symmetric process corner relative to TT that are configured to perform the following steps. Compare the ARO1 or ARO2 output frequency with a third threshold frequency, such as a baseline frequency measured for a TT die. If the ARO1 or ARO2 output frequency is less than the third threshold frequency, then the process is more toward SS (e.g., substantially at the SS process corner and thus identified as being substantially at the SS process corner). If the ARO1 or ARO2 output frequency is greater than the third threshold frequency, the process is more toward FF (e.g., substantially at the FF process corner and thus identified as being substantially at the FF process corner).

The first apparatus can also include a symmetrical ring oscillator (RO) integrated with the integrated circuit, means for applying the ultra-low power supply voltage to the RO, means for measuring an output frequency of the RO, and means for comparing a value of the output frequency of the RO to a fourth threshold frequency (e.g., a baseline frequency measured for the TT die), the ARO1 output frequency, the ARO2 output frequency, or any number of those. The RO includes pull-up transistors that have a RVT and pull-down transistors that have an RVT, and the applied ultra-low power supply voltage causes the integrated circuit to operate near a verge of malfunction. With the symmetrical (RVT only) RO, we can tell if the process corner is at SS or FF by comparing the RO output frequency with the fourth threshold frequency. If the RO output frequency is less than the baseline frequency measured for the TT die, then the process more toward SS (e.g., substantially at the SS process corner and thus identified as being substantially at the SS process corner). If the RO output frequency is greater than the baseline frequency measured for the TT die, the process is more toward FF (e.g., substantially at the FF process corner and thus identified as being substantially at the FF process corner). At least a part of the first apparatus can be integrated in a semiconductor die. Further, at least a part of the first apparatus can include a device, such as a mobile device, a base station, a set-top box, a music player, a video player, an entertainment device, a navigation device, a communications device, a fixed location data device, a computer, and/or a combination of the foregoing, with a part of the first apparatus being a constituent part of the device In another example, provided is a second apparatus configured to identify a process corner of an integrated circuit. The second apparatus includes a first asymmetrical ring oscillator (ARO1) integrated as a part of the integrated circuit. The ARO1 includes pull-up transistors that have a low threshold voltage (LVT) and pull-down transistors that have a regular threshold voltage (RVT). The second apparatus also includes a second asymmetrical ring oscillator (ARO2) integrated as a part of the integrated circuit. The ARO2 includes pull-up transistors that have an RVT and pull-down transistors having an LVT. The second apparatus also includes a processor and a memory coupled to the processor and configured to cause the processor to apply an ultra-low power supply voltage to the ARO1 and the ARO2, measure an output frequency of the ARO1, measure an output frequency of the ARO2, calculate a calculated ratio of the output frequency of the ARO1 and the output frequency of the ARO2, and compare the calculated ratio to a fiduciary ratio. The applied ultra-low power supply voltage causes the integrated circuit to operate near a verge of malfunction. The fiduciary ratio is of the output frequency of the ARO1 and the output frequency of the ARO2 at a TT, SS, or FF process corner. If the calculated ratio is more than a first number of times the fiduciary ratio or less than a second number of times the fiduciary ratio, then the value of the (manufactured) process variation of the integrated circuit and chip is substantially at an asymmetric process corner. If the calculated ratio does not meet the above test, then the value of the (manufactured) process variation of the integrated circuit and chip is substantially at a symmetric process corner. In addition, the memory can be further configured to cause the processor to determine the direction of the asymmetry with the following steps. If the calculated ratio is greater than the fiduciary ratio, then the asymmetric corner is FS (NFET fast, PFET slow). If the calculated ratio is less than the fiduciary ratio, then the asymmetric corner is SF (NFET slow, PFET fast). The memory can also be configured to cause the processor to determine the direction of the symmetric process corner relative to TT with the following steps: Compare the ARO1 or ARO2 output frequency with a fifth threshold frequency, such as a baseline frequency measured for a TT die. If the ARO1 or ARO2 output frequency is less than the fifth threshold frequency, then the process is more toward SS (e.g., substantially at the SS process corner and thus identified as being substantially at the SS process corner). If the ARO1 or ARO2 output frequency is greater than the fifth threshold frequency, the process is more toward FF (e.g., substantially at the FF process corner and thus identified as being substantially at the FF process corner). Optionally, the second apparatus further includes a symmetrical ring oscillator (RO) integrated with the integrated circuit. The RO includes pull-up transistors that have a RVT and pull-down transistors that have an RVT. The memory is further configured to cause the processor to apply the ultra-low power supply voltage to the RO, measure an output frequency of the RO, and compare a value of the output frequency of the RO to a sixth threshold frequency (e.g., a baseline frequency measured for the TT die), the ARO1 output frequency, the ARO2 output frequency, or any number of those. The applied ultra-low power supply voltage causes the integrated circuit to operate near a verge of malfunction. With the symmetrical (RVT only) RO, we can tell if the process corner is at SS or FF by comparing the RO output frequency with the sixth threshold frequency. If the RO output frequency is less than the baseline frequency measured for the TT die then the process more toward SS (e.g., substantially at the SS process corner and thus identified as being substantially at the SS process corner). If the RO output frequency is greater than the baseline frequency measured for the TT die, the process is more toward FF (e.g., substantially at the FF process corner and thus identified as being substantially at the FF process corner).

The foregoing broadly outlines some of the features and technical advantages of the present teachings in order that the detailed description and drawings can be better understood. Additional features and advantages are also described in the detailed description. The conception and disclosed examples can be used as a basis for modifying or designing other devices for carrying out the same purposes of the present teachings. Such equivalent constructions do not depart from the technology of the teachings as set forth in the claims. The inventive features that are characteristic of the teachings, together with further objects and advantages, are better understood from the detailed description and the accompanying figures. Each of the figures is provided for the purpose of illustration and description only, and does not limit the present teachings.

BRIEF DESCRIPTION OF THE DRAWINGS

The accompanying drawings are presented to describe examples of the present teachings, and are not limiting.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Methods and apparatus that monitor a process corner are provided. In an example, provided is an exemplary method for identifying a process corner of an integrated circuit (IC). The IC has a first asymmetrical ring oscillator (ARO1) including pull-up transistors that have a low threshold voltage (LVT) and pull-down transistors that have a regular threshold voltage (RVT), and has a second asymmetrical ring oscillator (ARO2) including pull-up transistors that have an RVT and pull-down transistors having an LVT. The exemplary method includes applying an ultra-low power supply voltage to the ARO1 and the ARO2 that causes the integrated circuit to operate near a verge of malfunction, measuring an output frequency of the ARO1, measuring an output frequency of the ARO2, calculating a ratio of the output frequency of the ARO1 divided by the output frequency of the ARO2, and comparing the calculated ratio to a fiduciary ratio to identify the process corner. The fiduciary ratio can be a ratio of the output frequency of the ARO1 and the output frequency of the ARO2 at a TT, SS, or FF process corner.

In a further example, an exemplary method for identifying a process corner of an IC lowers supply voltage (e.g., Vdd) applied to a pair of digital asymmetric ring oscillators (e.g., ARO1 and ARO2) and identifies a value of the supply voltage that causes the respective output frequencies of the pair of digital asymmetric ring oscillators to begin to increase radically (e.g., substantially exponentially). A radical increase in the respective output frequencies of the pair of digital asymmetric ring oscillators indicates the pair of asymmetric ring oscillators comprises transistors that are just barely switching or about to stop switching. The IC is at a process corner when the value of the supply voltage causes the respective output frequencies of the pair of digital asymmetric ring oscillators to begin to increase radically.

Examples are disclosed in this application's text and drawings. Alternate examples can be devised without departing from the scope of the disclosure. Additionally, conventional elements of the current teachings may not be described in detail, or may be omitted, to avoid obscuring aspects of the current teachings.

The following exemplary list of abbreviations, acronyms, and terms is provided to assist in comprehending the current disclosure, and are not provided as limitations.

ARO—Asymmetrical Ring Oscillator
ARO1—First Asymmetrical Ring Oscillator
ARO2—Second Asymmetrical Ring Oscillator
F—Fast
Faro1—Output Frequency of ARO1
Faro2—Output Frequency of ARO2
Fro—Output frequency of RO
FF—Fast-Fast process corner (NMOS fast, PMOS fast)
FS—Fast-Slow process corner (NMOS fast, PMOS slow)
IC—Integrated Circuit
Ieff—Effective Current
Ileak—Leakage Current
LVT—Low Threshold Voltage
NMOS—N-Channel Metal-Oxide-Silicon Field Effect Transistor
PMOS—P-Channel Metal-Oxide-Silicon Field Effect Transistor
PMU—Power Management Unit
RO—Ring Oscillator
RVT—Regular Threshold Voltage
S—Slow
SF—Slow-Fast process corner (NMOS slow, PMOS fast)
SS—Slow-Slow process corner (NMOS slow, PMOS slow)
T—Typical
Tfall_aro1—Fall Time of the Output of ARO1
Tfall_aro2—Fall Time of the Output of ARO2
Trise_aro1—Rise Time of the Output of ARO1
Trise_aro2—Rise Time of the Output of ARO2
TT—Typical-Typical process corner (NMOS typical, PMOS typical)
VDD—Power Supply Voltage As used herein, the term "exemplary" means "serving as an example, instance, or illustration." Any example described as "exemplary" is not necessarily to be construed as preferred or advantageous over other examples. Likewise, the term "examples" does not require that all examples include the discussed feature, advantage, or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

It should be noted that the terms "connected," "coupled," and any variant thereof, mean any connection or coupling between elements, either direct or indirect, and can encompass a presence of an intermediate element between two elements that are "connected" or "coupled" together via the intermediate element. Coupling and connection between the elements can be physical, logical, or a combination thereof. Elements can be "connected" or "coupled" together, for example, by using one or more wires, cables, printed electrical connections, electromagnetic energy, and the like. The electromagnetic energy can have a wavelength at a radio frequency, a microwave frequency, a visible optical frequency, an invisible optical frequency, and the like, as practicable. These are several non-limiting and non-exhaustive examples.

A reference using a designation such as "first," "second," and so forth does not limit either the quantity or the order of those elements. Rather, these designations are used as a convenient method of distinguishing between two or more elements or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" or "one or more of A, B, or C" or "at least one of the group consisting of A, B, and C" used in the description or the claims can be interpreted as "A or B or C or any combination of these elements." For example, this terminology can include A, or B, or C, or (A and B), or (A and C), or (B and C), or (A and B and C), or 2A, or 2B, or 2C, and so on.

The terminology used herein is for the purpose of describing particular examples only and is not intended to be limiting. As used herein, the singular forms "a," "an," and the include the plural forms as well, unless the context clearly indicates otherwise. Further, the terms "comprises," "comprising," "includes," and "including," specify a presence of a feature, an integer, a step, a block, an operation, an element, a component, and the like, but do not necessarily preclude a presence or an addition of another feature, integer, step, block, operation, element, component, and the like.

In at least one example, the provided apparatuses can be a part of, and/or coupled to, an electronic device such as, but not limited to, at least one of a mobile device, a navigation device (e.g., a global positioning system receiver), a wireless device a camera, an audio player, a camcorder, and a game console.

The term "mobile device" can describe, and is not limited to, at least one of a mobile phone, a mobile communication device, a pager, a personal digital assistant, a personal information manager, a personal data assistant, a mobile hand-held computer, a portable computer, a tablet computer, a wireless device, a wireless modem, other types of portable electronic devices typically carried by a person and having communication capabilities (e.g., wireless, cellular, infrared, short-range radio, etc.), and/or any other device that is capable of receiving wireless communication signals used in determining a position fix. Further, the terms "user equipment" (UE), "mobile terminal," "user device," "mobile device," and "wireless device" can be interchangeable.

Figure 1:
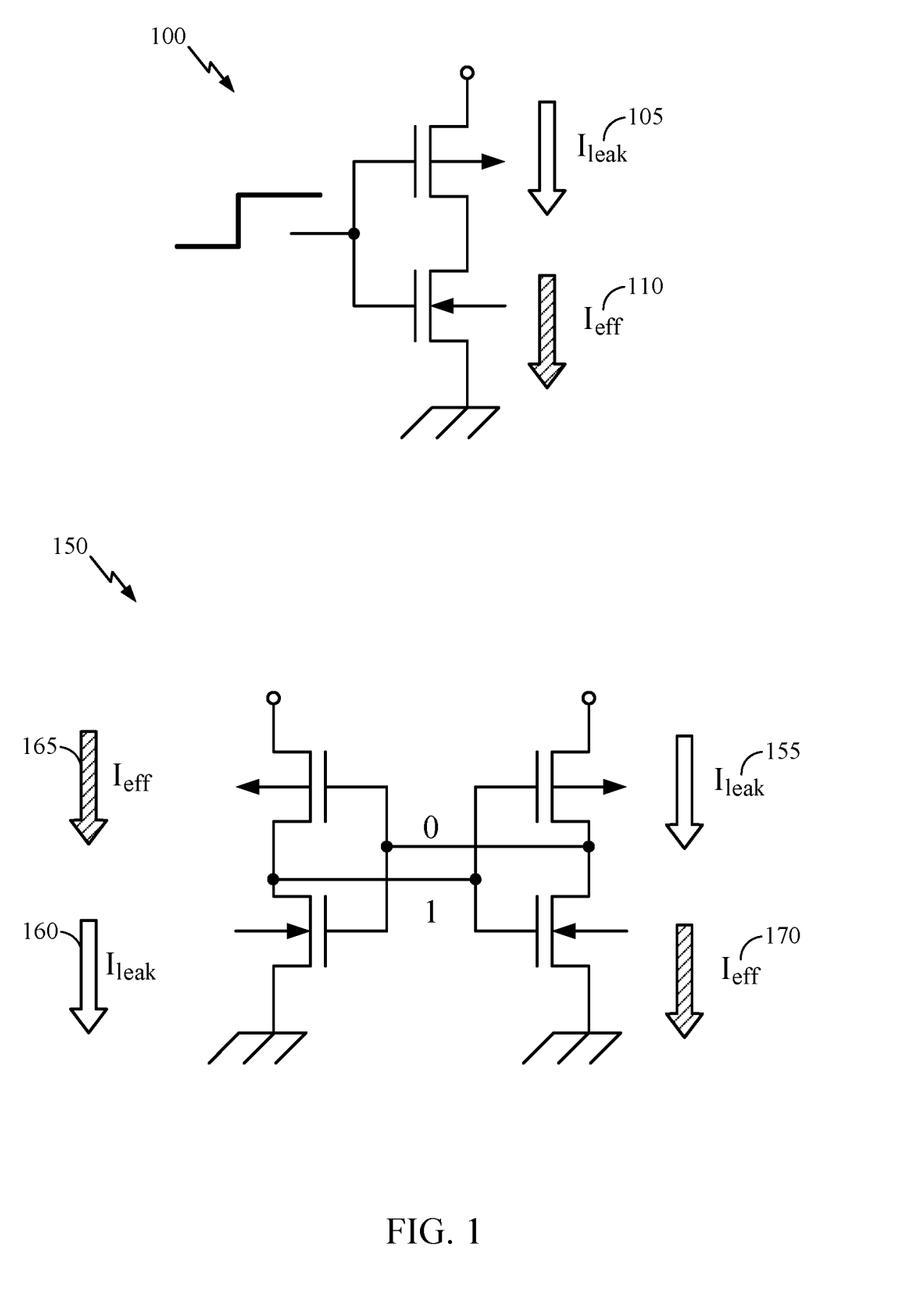
FIG. 1 is a graphical illustration that depicts exemplary contention between leakage current and effective current.

FIG. 1 depicts how asymmetric process corners, such as FS (e.g., fast-N, slow-P) and SF (e.g., slow-N, fast-P), can have a detrimental effect on the integrated circuit's minimum operating voltage. FIG. 1 depicts this effect in a first circuit 100 and a second circuit 150. The effect occurs due to exacerbated contention between leakage current (Ileak) 105, 155, 160, and effective current (Ieff) 110, 165, 170. Thus, it is desirable to detect the integrated circuit's minimum operating voltage values associated with process corners, including asymmetrical process corners, symmetrical process corners, or a combination thereof.

Figure 2:
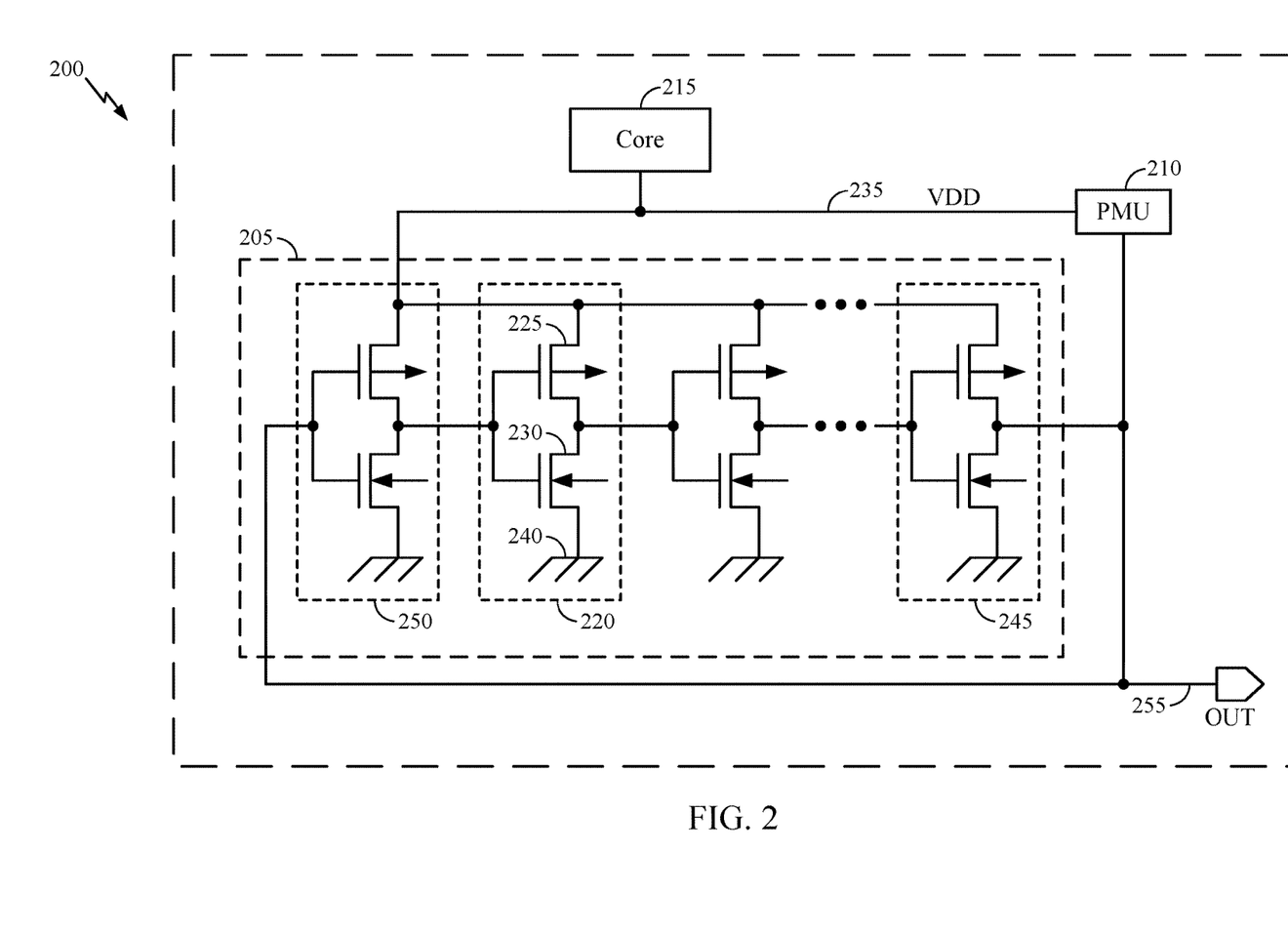
FIG. 2 is a schematic that depicts an exemplary integrated circuit having a ring oscillator.

FIG. 2 depicts an exemplary integrated circuit 200 having a ring oscillator (RO) 205 having an odd number of inversion stages. FIG. 2 also depicts a power management unit (PMU) 210 and a core 215. The RO 205 includes a plurality of cells 220, 250, 245 . . . . The cell 220 includes a PMOSFET 225 and an NMOSFET 230, coupled in series between a PMU output voltage (VDD) 235 and ground 240, and configured as an inverter. Iterations of the cells 220 are coupled in series to form the RO 205, with an output of a last cell 245 (OUT) being fed back to an input of a first cell 250 to form a ring. During operation, each cell outputs a respective high or low value, with the values alternately propagating through each iteration of the cells in the RO 205. Thus, the RO 205 generates a waveform that is substantially a square wave. When a propagated value reaches the output of the last cell 245, the propagated value is recycled back to the input of the first cell 250 and thus, around the ring. The output 255 of the last cell 245 is also fed to the power management unit 210. The output 255 of the last cell is the output of the RO 205 and has an RO output frequency (Fro). Further, by changing the respective threshold voltage of the PMOSFET 225, the respective threshold voltage of the NMOSFET 230, or both, an asymmetric ring oscillator (ARO) can be fabricated as the RO 205.

In other examples, the RO 205 includes at least one logic gate (e.g., NAND, NOR, the like, or combinations thereof) in the cell 220 as an alternative to using the PMOSFET 225 and the NMOSFET 230.

The power management unit (PMU) 210 can receive the output of the RO 205, and can control the PMU output voltage (VDD) 235 that is applied to both the RO 205 and a core 215. In examples, the PMU can be on-die or off-chip. The core 215 can be a processor core. The VDD 235 can be adjusted such that the VDD 235 is higher than a minimum voltage at which the core 215 can function. Adjustment of the VDD 235 can include using a look-up table to correlate the output of the RO 205 to the VDD 235. In an example, the PMU 210 can correlate the output of the RO 205 to the minimum voltage at which the core 215 can function, a range of voltages at which the core 215 can function, the like, or a practicable combination thereof. The look-up table can be stored in a non-volatile memory. In an example, the PMU 210 can perform at least a part of a method described herein, and thus the PMU 210 can be a means for performing at least a part of a method described herein.

In an example, a control circuit (e.g., a controller, a processor, the like, or a combination thereof) can receive the output from the RO 205, determine at least one process corner, and request that the PMU 210 adjust the PMU output voltage (VDD) 235. In an example, at least a portion of the control circuit can be a constituent part of the PMU 210. In an example, at least a portion of the control circuit is not a constituent part of the PMU 210. In an example, the control circuit can be a means for measuring an output frequency of the RO 205, a means for comparing a value of the output frequency of the RO 205 to a threshold value, and the like.

Figure 3A:
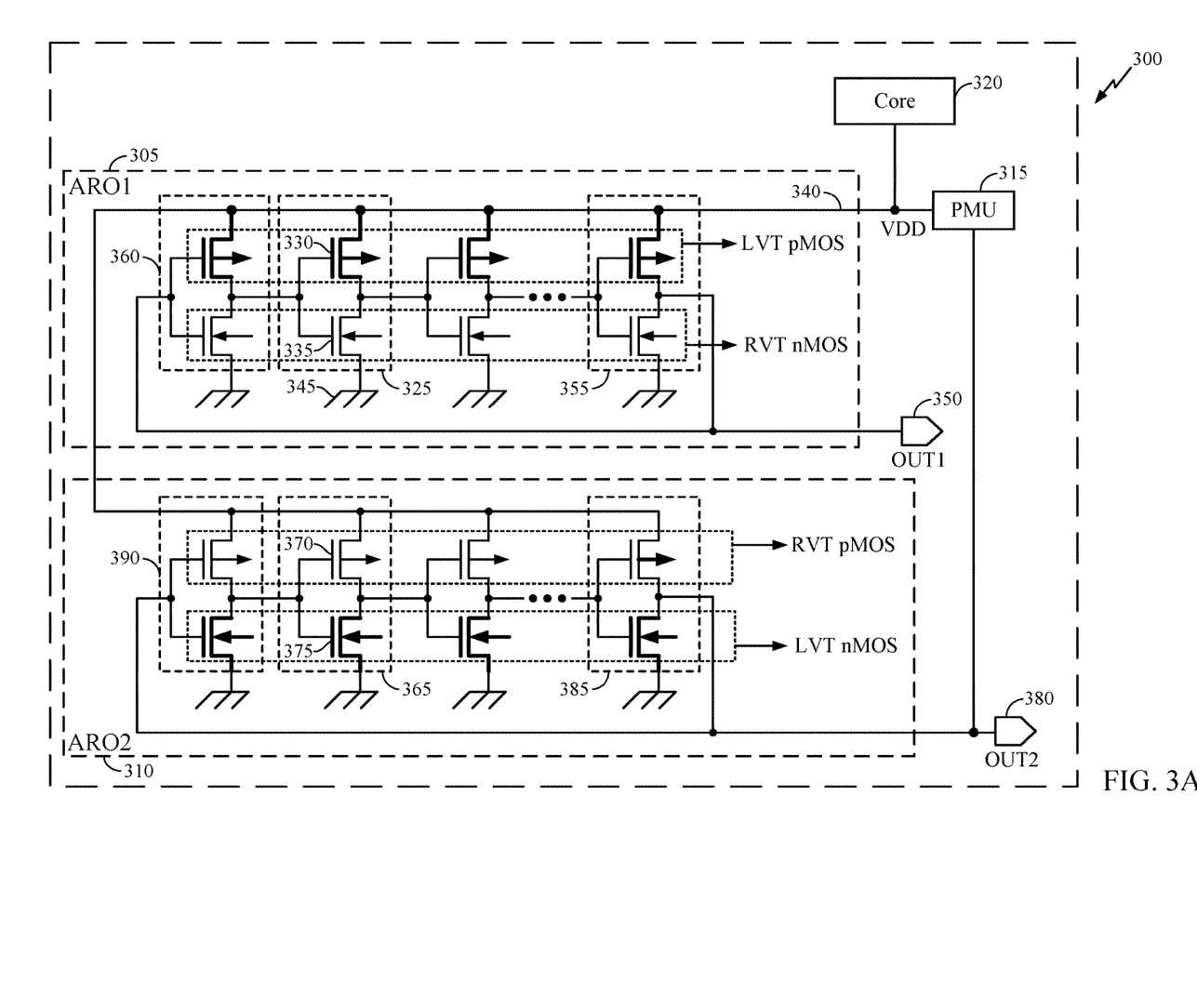
FIGS. 3A-3B are graphical illustrations that depict an exemplary integrated circuit having an exemplary first asymmetrical ring oscillator and a second asymmetrical ring oscillator.

FIG. 3A depicts an exemplary integrated circuit 300 having an exemplary first asymmetrical ring oscillator (ARO1) 305, an exemplary second asymmetrical ring oscillator (ARO2) 310, a power management unit (PMU) 315, and a core 320. In an example, the PMU 315 can perform at least a part of a method described herein, and thus the PMU 315 can be a means for performing at least a part of a method described herein (e.g., the PMU 315 can be a means for measuring, a means for calculating, a means for comparing, etc.). In an example, the integrated circuit 200 and the integrated circuit 300 are the same device. In an example, the PMU 210 and the PMU 315 are the same device. In an example, the core 215 and the core 320 are the same device.

The ARO1 305 includes a plurality of cells similar to cell 325. The cell 325 includes a LVT PMOSFET 330 and an RVT NMOSFET 335 coupled in series between a PMU output voltage (VDD) 340 and ground 345. The LVT of the PMOSFET 330 can be realized through: 1.) deploying (e)LVT devices, 2.) forward body-biasing a transistor, or 3.) both. Iterations of the cells 325 are coupled in series to form the ARO1 305, with an output 350 (OUT1) of a last cell 355 (which is an iteration of the cell 325) being fed back to an input of a first cell 360 (which is an iteration of the cell 325) to form a ring. During operation, each cell outputs a respective high or low value, with the values alternately propagating through each iteration of the cell 325 in the ARO1 305. Thus, the ARO1 305 generates a waveform that can substantially be a square wave. When a propagated value reaches the OUT1 350 of the last cell 355, the propagated value is recycled back to the input of the first cell 360 and thus, around the ring of the ARO1 305. The OUT1 350 of the last cell 355 is also fed to the power management unit 315. The OUT1 350 of the last cell 355 is the output of the ARO1 305 and has an ARO1 output frequency (Fro1).

When an ultra-low power supply voltage (e.g., the VDD 340) is applied to the ARO1 305, the RVT NMOSFET 335 devices operate in a sub-threshold regime, so a delay in the stages of the ARO1 305 due to sub-threshold operation of the RVT NMOSFET 335 devices increases exponentially. Further, when the ultra-low power supply voltage is applied to the ARO1 305, the LVT PMOSFET 330 devices in the ARO1 305 operate in a super-threshold regime or a near-threshold regime, so a delay in the stages of the ARO1 305 due to the LVT PMOSFET 330 devices operating in the super-threshold regime or the near-threshold regime only increases linearly. Thus, the ARO1 305 is configured to have higher frequency at a FS asymmetrical process corner than an SF asymmetrical process corner, and thus the ARO1 305 is configured to indicate the SF asymmetrical process corner. In a non-limiting example, the OUT1 350 of ARO1 305 provides an output signal in which tfall_aro1>>trise_aro1 (e.g., ~20× larger at VDD=0.3 VDC, when compared to VDD=1.0 VDC).

In an example, a super-threshold regime is a first range of supply voltages causing current to flow in a transistor (i.e., the transistor is "on"), where the super-threshold regime is not a part of a near-threshold regime. In an example, a near-threshold regime is a second range of supply voltages causing current to flow in a transistor (i.e., the transistor is "on"), where the near-threshold regime is not a part of a super-threshold regime, and the near-threshold regime includes Vt (threshold voltage).

The ARO2 310 includes a plurality of cells 365. The cell 365 includes a RVT PMOSFET 370 and an LVT NMOSFET 375 coupled in series between the PMU output voltage (VDD) 340 and ground 345. The LVT of the NMOSFET 375 can be realized through: 1.) deploying (e)LVT devices, 2.) forward-body biasing a transistor, or 3.) both. Iterations of the cells 365 are coupled in series to form the ARO2 310, with an output 380 (OUT2) of a last cell 385 (which is an iteration of the cell 365) being fed back to an input of a first cell 390 (which is an iteration of the cell 365) to form a ring. During operation, each cell outputs a respective high or low value, with the values alternately propagating through each iteration of the cell 365 in the ARO2 310. Thus, the ARO2 310 generates a waveform that can substantially be a square wave. When a propagated value reaches the OUT2 380 of the last cell 385, the propagated value is recycled back to the input of the first cell 390 and thus, around the ring of the ARO2 310. The OUT2 380 of the last cell 385 is also fed to the power management unit 315. The OUT2 380 of the last cell 385 is the output of the ARO2 310 and has an ARO2 output frequency (Fro2).

When an ultra-low power supply voltage (e.g., the VDD 340) is applied to the ARO2 310, the RVT PMOS FETs 370 operate in a sub-threshold regime, so a delay in the stages of the ARO2 310 due to sub-threshold operation of the RVT PMOS FET 370 devices increases exponentially, e.g. are 20 times larger than a nominal Vdd will indicate that the sub threshold region has been reached, and any further reduction in Vdd will either slow the circuit exponentially or cause its operation to be compromised or stopped. Further, when the ultra-low power supply voltage is applied to the ARO2 310, the LVT NMOSFET 375 devices in the ARO2 310 operate in a super-threshold regime or a near-threshold regime, so a delay in the stages of the ARO2 310 due to the LVT NMOSFET 375 devices operating in the super-threshold regime or the near-threshold regime only increases linearly. Thus, the ARO2 310 is configured to have a higher frequency at an SF asymmetrical process corner than a FS asymmetrical process corner, and thus the ARO2 310 is configured to indicate the FS asymmetrical process corner. In a non-limiting example, the OUT2 380 of ARO2 310 provides an output signal in which trise_aro2>>tfall_aro2 (e.g., ~20× larger at VDD=0.3 VDC, when compared to VDD=1.0 VDC).

Figure 3B:
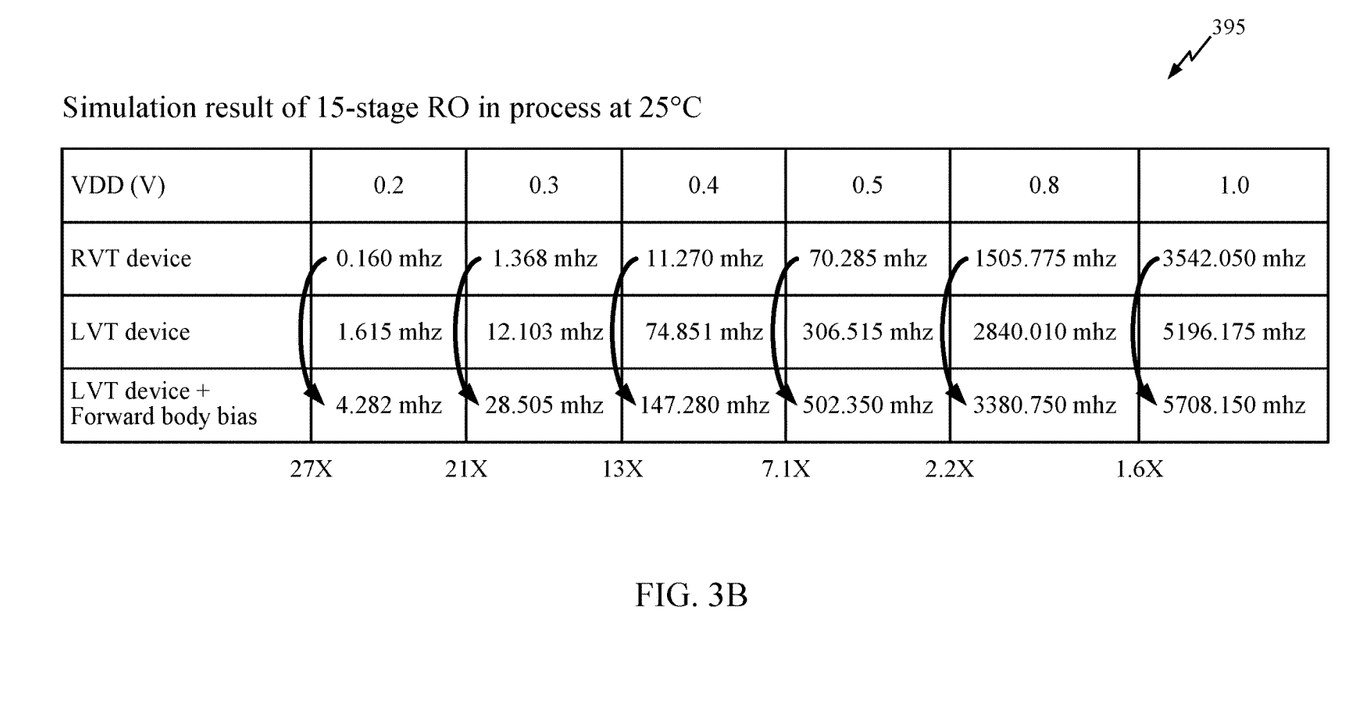

Accordingly, applying the ultra-low power supply voltage to the ARO1 305 and the ARO2 310 produces asymmetrical outputs from the output 350 (OUT1) and the output 380 (OUT2). FIG. 3B depicts an exemplary simulation result of applying different supply voltages (e.g. VDD 235) to a fifteen-stage RO in an exemplary process at a temperature of 25 C. As can be seen from the chart, as VDD decreases (e.g., from 1.0 VDC to 0.2 VDC), the ratio of an output frequency of the combination of an LVT device to which a forward body bias is applied to an output frequency of an RVT device increases (e.g., from 1.6× to 27×).

In an example, a control circuit (e.g., a controller, a processor, the like, or a combination thereof) can receive the respective outputs from the ARO1 305 and the ARO2 310, determine at least one process corner, and request that the PMU 315 adjust the PMU output voltage (VDD) 340. In an example, at least a portion of the control circuit can be a constituent part of the PMU 210. In an example, at least a portion of the control circuit is not a constituent part of the PMU 210. In an example, the control circuit can be a means for applying an ultra-low power supply voltage to the ARO1 305 and the ARO2 315, a means for measuring an output frequency of the ARO1 305, a means for measuring an output frequency of the ARO2 310, a means for calculating a calculated ratio of the output frequency of the ARO1 305 and the output frequency of the ARO2 310, a means for comparing the calculated ratio to a fiduciary ratio, a means for comparing the output frequency of the ARO1 305 to a threshold value, a means for comparing the output frequency of the ARO2 310 to the threshold value, and the like.

Figure 4A:
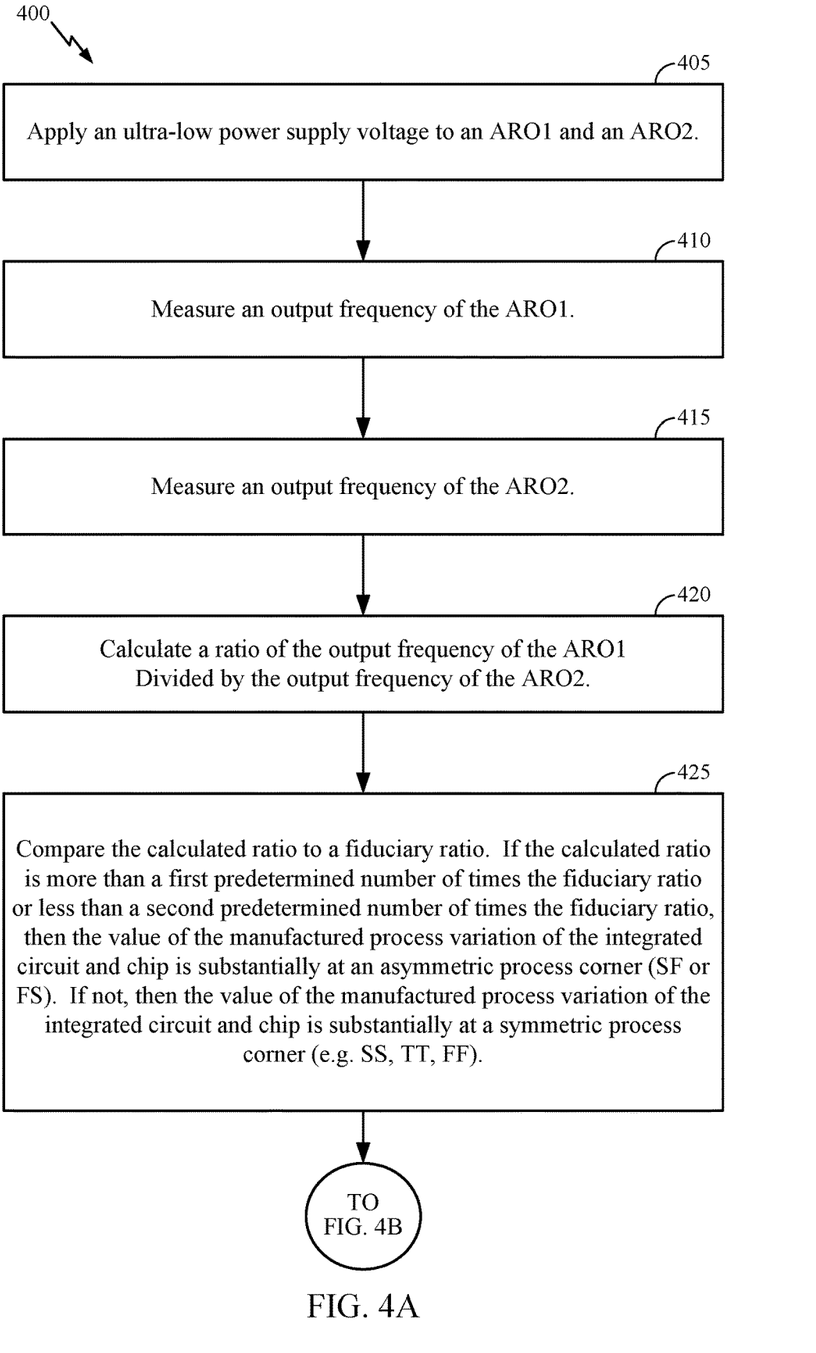
FIGS. 4A-4B is a flow diagram that depicts an exemplary method that identifies a process corner of an integrated circuit.
Figure 4B:
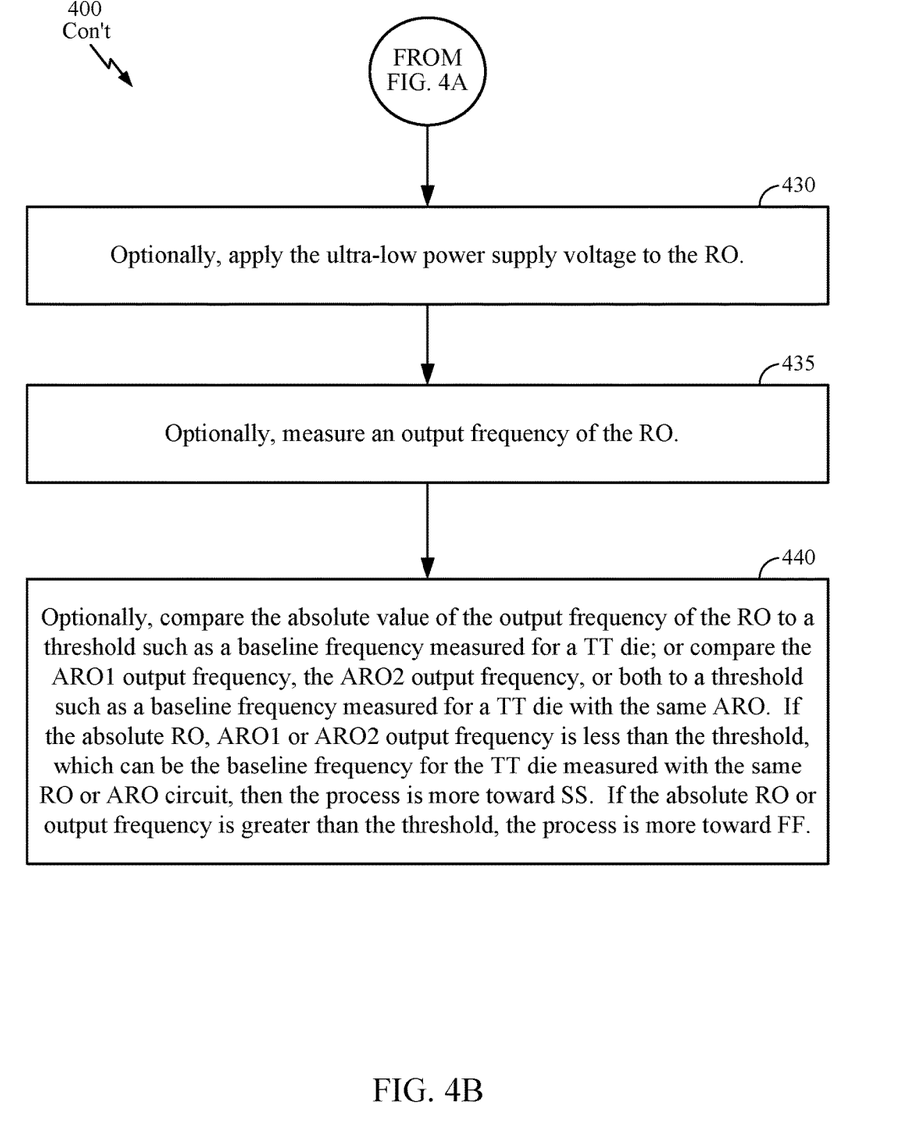

FIGS. 4A-4B depict an exemplary method that identifies a process corner of an integrated circuit 400. Knowing values identifying the process corners identifies limits of a minimum operating voltage of an integrated circuit implementing near-threshold and sub-threshold computing. The method that identifies a process corner of an integrated circuit 400 can be performed by the apparatus described hereby, such as at least a portion of the integrated circuit 200, at least a portion of the integrated circuit 300, or a combination thereof. The integrated circuit upon which the method that identifies the process corner of the integrated circuit 400 has: 1.) a first asymmetrical ring oscillator (ARO1) including pull-up transistors that have a low threshold voltage (LVT) and pull-down transistors that have a regular threshold voltage (RVT), and 2.) a second asymmetrical ring oscillator (ARO2) including pull-up transistors that have an RVT and pull-down transistors having an LVT.

In block 405, an ultra-low power supply voltage (e.g., VDD) is applied to the ARO1 and the ARO2. The applied ultra-low power supply voltage causes the integrated circuit to operate near a verge of malfunction. When the ultra-low power supply voltage is applied to the ARO1 and the ARO2, the RVT devices in the ARO1 and the ARO2 operate in a sub-threshold regime, so a delay in the stages of the ARO1 and the ARO2 due to sub-threshold operation of the RVT devices increases exponentially. Further, when the ultra-low power supply voltage is applied to the ARO1 and the ARO2, the LVT devices in the ARO1 and the ARO2 operate in a super-threshold regime or a near-threshold regime, so a delay in the stages of the ARO1 and the ARO2 due to the LVT devices operating in the super-threshold regime or the near-threshold regime only increases linearly. Thus, for ARO1, tfall_aro1>>trise_aro1 (e.g., ~20× larger@0.3V VDD). Further, for ARO2, trise_aro2>>tfall_aro2 (e.g., ~20× larger@0.3V VDD).

In block 410, an output frequency of the ARO1 is measured.

In block 415, an output frequency of the ARO2 is measured.

In block 420, a calculated ratio of the output frequency of the ARO1 and the output frequency of the ARO2 is calculated. Since fARO1/fARO2 substantially approximates trise_aro2/tfall_aro1, the calculated ratio can be used as a substantially precise indicator of p/n device mismatch.

In block 425, the calculated ratio is compared to a fiduciary ratio. The fiduciary ratio is a ratio of the output frequency of the ARO1 to the output frequency of the ARO2 at a symmetric process corner (TT, SS, or FF). The FS and SF corners have disproportionately abnormal (high or low) ratios relative to the ratios occurring at the TT, SS, and FF corners. If the calculated ratio is more than a first number of times (e.g., 1.5×) the fiduciary ratio or less than a second number of times (e.g., 0.75×) the fiduciary ratio, then the value of the (manufactured) process variation of the integrated circuit and chip is substantially at an asymmetric process corner (SF or FS). If not, then the value of the (manufactured) process variation of the integrated circuit and chip is substantially at a symmetric process corner (e.g., SS, TT, FF). The calculated ratio is a digital value and the fiduciary ratio is a digital value. The calculated ratio, the first number of times the fiduciary ratio, and the second number of times the fiduciary ratio each vary with different process technologies and with different operating conditions (voltage, temperature, etc.). These ratios not only indicate whether the silicon is in an absolute FS/SF corner, but they also can be used to quantify the skewness of the process. With mass production and post-silicon characterization, fixed threshold values (e.g., 1.5, 1.25, 0.75, 0.5, the like) for the first number of times the fiduciary ratio and the second number of times the fiduciary ratio can be determined and used to "bin" fabricated chips.

Blocks 430 to 440 are optional, and can be performed when the integrated circuit further includes a symmetrical ring oscillator (RO) including pull-up transistors that have a RVT and pull-down transistors that have an RVT.

In optional block 430, the ultra-low power supply voltage is applied to the RO. The applied ultra-low power supply voltage causes the integrated circuit to operate near a verge of malfunction.

In optional block 435, an output frequency of the RO is measured.

In optional block 440, the value of the output frequency of the RO is compared to a threshold such as a baseline frequency measured for a TT die, or the ARO1 output frequency, the ARO2 output frequency, or both are compared to a threshold such as a baseline frequency measured for a TT die with the same ARO. If the RO, ARO1 or ARO2 output frequency is less than the threshold, which can be the baseline frequency for the TT die measured with the same RO or ARO circuit, then the process is more toward SS (e.g., substantially at the SS process corner and thus identified as being substantially at the SS process corner). If the RO or output frequency is greater than the threshold, the process is more toward FF (e.g., substantially at the FF process corner and thus identified as being substantially at the FF process corner). Determining if the RO is operating at a process corner can also include using a look-up table to correlate the output of the RO to characterized data recorded in the look-up table. The look-up table can be stored in a non-volatile memory.

The foregoing blocks are not limiting of the examples. The blocks can be combined and/or the order can be rearranged, as practicable.

Figure 5:
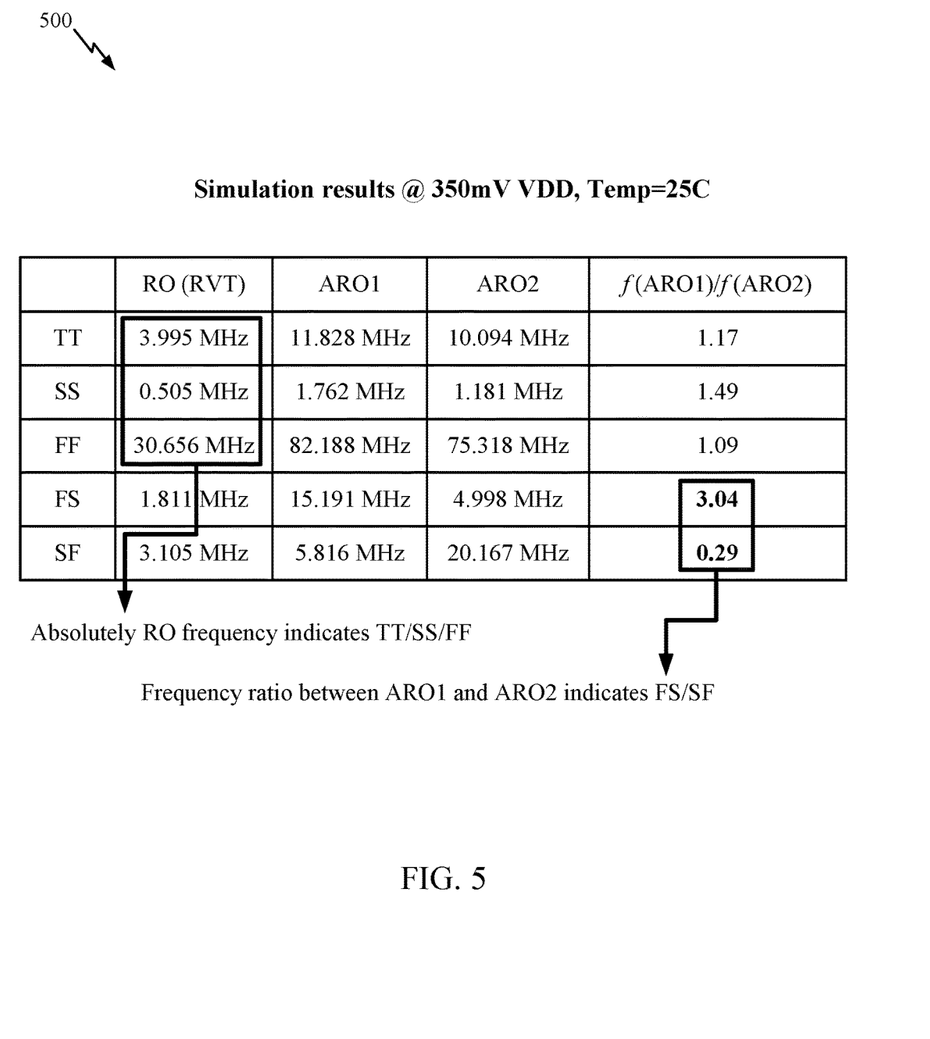
FIG. 5 is a chart that depicts exemplary results from a simulated execution of the method of FIGS. 4A-4B.

FIG. 5 depicts exemplary simulation results 500 from a simulated execution of blocks 405-440.

Further, those of skill in the art will appreciate that the exemplary logical blocks, modules, circuits, and steps described in the examples disclosed herein can be implemented as electronic hardware, or combinations of both hardware and software, as practicable.

At least a portion of the methods, sequences, and/or algorithms described in connection with the examples disclosed herein can be embodied directly in hardware, in software executed by a processor (e.g., a processor described hereby), in a combination with hardware. In an example, a processor includes multiple discrete hardware components. A software module can reside in a storage medium (e.g., a memory device), such as a random-access memory (RAM), a flash memory, a read-only memory (ROM), an erasable programmable read-only memory (EPROM), an electrically erasable programmable read-only memory (EEPROM), a register, a hard disk, a removable disk, a compact disc read-only memory (CD-ROM), a Subscriber Identity Module (SIM) card, a Universal Subscriber Identity Module (USIM) card, and/or any other form of storage medium. An exemplary storage medium (e.g., a memory device) can be coupled to the processor such that the processor can read information from, and/or write information to, the storage medium. In an example, the storage medium can be integral with the processor.

Further, examples provided hereby are described in terms of sequences of actions to be performed by, for example, elements of a computing device. The actions described herein can be performed by a specific circuit (e.g., an application specific integrated circuit (ASIC)), by program instructions being executed by one or more processors, or by a combination of both. Additionally, a sequence of actions described herein can be considered to be entirely within any form of computer readable storage medium having stored therein a corresponding set of computer instructions that, upon execution, would cause an associated processor (such as a special-purpose processor) to perform a portion of a function described herein. Thus, examples may be in a number of different forms, all of which have been contemplated to be within the scope of the disclosure. In addition, for each of the examples described herein, a corresponding electrical circuit of any such examples may be described herein as, for example, "logic configured to" perform a described action.

The disclosed devices and methods can be designed and can be configured into a computer-executable file that is in a Graphic Database System Two (GDSII) compatible format, an Open Artwork System Interchange Standard (OASIS) compatible format, and/or a GERBER (e.g., RS-274D, RS-274X, etc.) compatible format, which can be stored on a non-transitory (i.e., a non-transient) computer-readable media. The file can be provided to a fabrication handler who fabricates with a lithographic device, based on the file, an integrated device. Deposition of a material to form at least a portion of a structure described herein can be performed using deposition techniques such as physical vapor deposition (PVD, e.g., sputtering), plasma-enhanced chemical vapor deposition (PECVD), thermal chemical vapor deposition (thermal CVD), and/or spin-coating, and the like. Etching of a material to form at least a portion of a structure described herein can be performed using etching techniques such as plasma etching. In an example, the integrated device is on a semiconductor wafer. The semiconductor wafer can be cut into a semiconductor die and packaged into a semiconductor chip. The semiconductor chip can be employed in a device described herein (e.g., a mobile device, an access device, and/or the like).

At least one example provided hereby can include a non-transitory (i.e., a non-transient) machine-readable media and/or a non-transitory (i.e., a non-transient) computer-readable media storing processor-executable instructions configured to cause a processor (e.g., a special-purpose processor) to transform the processor and any other cooperating devices into a machine (e.g., a special-purpose processor) configured to perform at least a part of a function described hereby and/or a method described hereby. Performing at least a part of a function described hereby can include initiating at least a part of a function described hereby. In an example, execution of the stored instructions can transform a processor and any other cooperating devices into at least a part of an apparatus described hereby. A non-transitory (i.e., a non-transient) machine-readable media specifically excludes a transitory propagating signal. Further, at least one embodiment of the invention can include a computer readable media embodying at least a part of a method described herein. Accordingly, any means for performing the functions described herein are included in at least one embodiment of the invention. A non-transitory (i.e., a non-transient) machine-readable media specifically excludes a transitory propagating signal.

Nothing stated or depicted in this application is intended to dedicate any component, step, block, feature, object, benefit, advantage, or equivalent to the public, regardless of whether the component, step, block, feature, object, benefit, advantage, or the equivalent is recited in the claims.

While this disclosure describes examples, changes and modifications can be made to the examples disclosed herein without departing from the scope defined by the appended claims. The present disclosure is not intended to be limited to the specifically disclosed examples alone.

What is claimed is:

1. A method for identifying a process corner of an integrated circuit having a first asymmetrical ring oscillator (ARO1) including pull-up transistors that have a low threshold voltage (LVT) and pull-down transistors that have a regular threshold voltage (RVT), and a second asymmetrical ring oscillator (ARO2) including pull-up transistors that have an RVT and pull-down transistors having an LVT, comprising:
    applying an ultra-low power supply voltage to the ARO1 and the ARO2, wherein the applied ultra-low power supply voltage causes the integrated circuit to operate near a verge of malfunction;
    measuring an output frequency of the ARO1;
    measuring an output frequency of the ARO2;
    calculating a calculated ratio of the output frequency of the ARO1 and the output frequency of the ARO2; and
    comparing the calculated ratio to a fiduciary ratio, wherein the fiduciary ratio is of the output frequency of the ARO1 and the output frequency of the ARO2 at a typical-typical (TT) process corner, a slow-slow (SS) process corner, or a fast-fast (FF) process corner, and wherein if the calculated ratio is more than a first number of times the fiduciary ratio or less than a second number of times the fiduciary ratio, then a value of a manufactured process variation of the integrated circuit is substantially at an asymmetric process corner.

2. The method of claim 1, wherein the ratio of the output frequency of the ARO1 to the output frequency of the ARO2 is a digital value, and the fiduciary ratio is a digital value.

3. The method of claim 1, further comprising at least one of:
    comparing the output frequency of the ARO1 to a threshold value, wherein if the output frequency of the ARO1 is less than the threshold value, then the value of the manufactured process variation of the integrated circuit is more toward the SS process corner, and if the output frequency of the ARO1 is greater than the threshold value, the value of the manufactured process variation of the integrated circuit is more toward the FF process corner; and
    comparing the output frequency of the ARO2 to the threshold value, wherein if the output frequency of the ARO2 is less than the threshold value, then the value of the manufactured process variation of the integrated circuit is more toward the SS process corner, and if the output frequency of the ARO2 is greater than the threshold value, the value of the manufactured process variation of the integrated circuit is more toward the FF process corner.

4. The method of claim 1, wherein the integrated circuit further includes a symmetrical ring oscillator (RO) including pull-up transistors that have a RVT and pull-down transistors that have an RVT, further comprising:
    applying the ultra-low power supply voltage to the RO, wherein the applied ultra-low power supply voltage causes the integrated circuit to operate near a verge of malfunction;
    measuring an output frequency of the RO; and
    comparing a value of the output frequency of the RO to a threshold value;
    wherein if the value is equal to, or lower than, the threshold value, then the value of the manufactured process variation of the integrated circuit is more toward the SS process corner, and if the output frequency of the ARO is greater than the threshold value, the value of the manufactured process variation of the integrated circuit is more toward the FF process corner.

5. The method of claim 4, wherein the threshold value is a digital value.

6. The method of claim 1, further comprising forming the ARO1 and the ARO2 on a substrate of the integrated circuit.

7. The method of claim 1, further comprising integrating the integrated circuit into a mobile device, a music player, a video player, an entertainment unit, a navigation device, a communications device, a tablet, a computer, or a combination thereof.

8. An apparatus configured to identify a process corner of an integrated circuit, comprising:
    a first asymmetrical ring oscillator (ARO1) integrated as a part of the integrated circuit, wherein the ARO1 includes pull-up transistors that have a low threshold voltage (LVT) and pull-down transistors that have a regular threshold voltage (RVT);
    a second asymmetrical ring oscillator (ARO2) integrated as a part of the integrated circuit, wherein the ARO2 includes pull-up transistors that have an RVT and pull-down transistors having an LVT;
    means for applying an ultra-low power supply voltage to the ARO1 and the ARO2, wherein the applied ultra-low power supply voltage causes the integrated circuit to operate near a verge of malfunction;
    means for measuring an output frequency of the ARO1;
    means for measuring an output frequency of the ARO2;
    means for calculating a calculated ratio of the output frequency of the ARO1 and the output frequency of the ARO2; and
    means for comparing the calculated ratio to a fiduciary ratio, wherein the fiduciary ratio is of the output frequency of the ARO1 and the output frequency of the ARO2 at a typical-typical (TT) process corner, a slow-slow (SS) process corner, or a fast-fast (FF) process corner, and wherein if the calculated ratio is more than a first number of times the fiduciary ratio or less than a second number of times the fiduciary ratio, then a value of a manufactured process variation of the integrated circuit is substantially at an asymmetric process corner.

9. The apparatus of claim 8, wherein the ratio of the output frequency of the ARO1 to the output frequency of the ARO2 is a digital value, and the fiduciary ratio is a digital value.

10. The apparatus of claim 8, further comprising at least one of:
    means for comparing the output frequency of the ARO1 to a threshold value, wherein if the output frequency of the ARO1 is less than the threshold value, then the value of the manufactured process variation of the integrated circuit is more toward the SS process corner, and if the output frequency of the ARO1 is greater than the threshold value, the value of the manufactured process variation of the integrated circuit is more toward the FF process corner; and means for comparing the output frequency of the ARO2 to the threshold value, wherein if the output frequency of the ARO2 is less than the threshold value, then the value of the manufactured process variation of the integrated circuit is more toward the SS process corner, and if the output frequency of the ARO2 is greater than the threshold value, the value of the manufactured process variation of the integrated circuit is more toward the FF process corner.

11. The apparatus of claim 8, further comprising:
a symmetrical ring oscillator (RO) integrated with the integrated circuit, wherein the RO includes pull-up transistors that have a RVT and pull-down transistors that have an RVT;
means for applying the ultra-low power supply voltage to the RO, wherein the applied ultra-low power supply voltage causes the integrated circuit to operate near a verge of malfunction;
means for measuring an output frequency of the RO; and
means for comparing a value of the output frequency of the RO to a threshold value,
wherein if the value is equal to, or lower than, the threshold value, then the value of the manufactured process variation of the integrated circuit is more toward the SS process corner, and if the output frequency of the ARO is greater than the threshold value, the value of the manufactured process variation of the integrated circuit is more toward the FF process corner.

12. The apparatus of claim 8, wherein the threshold value is a digital value.

13. The apparatus of claim 8, further comprising a mobile device, a music player, a video player, an entertainment unit, a navigation device, a communications device, a tablet, a computer, or a combination thereof, of which the integrated circuit is a constituent part.

14. An apparatus configured to identify a process corner of an integrated circuit, comprising:
a first asymmetrical ring oscillator (ARO1) integrated as a part of the integrated circuit, wherein the ARO1 includes pull-up transistors that have a low threshold voltage (LVT) and pull-down transistors that have a regular threshold voltage (RVT);
a second asymmetrical ring oscillator (ARO2) integrated as a part of the integrated circuit, wherein the ARO2 includes pull-up transistors that have an RVT and pull-down transistors having an LVT;
a processor; and
a memory coupled to the processor and configured to cause the processor to:
apply an ultra-low power supply voltage to the ARO1 and the ARO2, wherein the applied ultra-low power supply voltage causes the integrated circuit to operate near a verge of malfunction;
measure an output frequency of the ARO1;
measure an output frequency of the ARO2;
calculate a calculated ratio of the output frequency of the ARO1 and the output frequency of the ARO2; and
compare the calculated ratio to a fiduciary ratio, wherein the fiduciary ratio is of the output frequency of the ARO1 and the output frequency of the ARO2 at a typical-typical (TT) process corner, a slow-slow (SS) process corner, or a fast-fast (FF) process corner, and wherein if the calculated ratio is more than a first number of times the fiduciary ratio or less than a second number of times the fiduciary ratio, then a value of a manufactured process variation of the integrated circuit is substantially at an asymmetric process corner.

15. The apparatus of claim 14, wherein the ratio of the output frequency of the ARO1 to the output frequency of the ARO2 is a digital value, and the fiduciary ratio is a digital value.

16. The apparatus of claim 14, wherein the memory is further configured to cause the processor to at least one of:
compare the output frequency of the ARO1 to a threshold value, wherein if the output frequency of the ARO1 is less than the threshold value, then the value of the manufactured process variation of the integrated circuit is more toward the SS process corner, and if the output frequency of the ARO1 is greater than the threshold value, the value of the manufactured process variation of the integrated circuit is more toward the FF process corner; and
compare the output frequency of the ARO2 to the threshold value, wherein if the output frequency of the ARO2 is less than the threshold value, then the value of the manufactured process variation of the integrated circuit is more toward the SS process corner, and if the output frequency of the ARO2 is greater than the threshold value, the value of the manufactured process variation of the integrated circuit is more toward the FF process corner.

17. The apparatus of claim 14, further comprising a symmetrical ring oscillator (RO) integrated with the integrated circuit, wherein the RO includes pull-up transistors that have a RVT and pull-down transistors that have an RVT, wherein the memory is further configured to cause the processor to:
apply the ultra-low power supply voltage to the RO, wherein the applied ultra-low power supply voltage causes the integrated circuit to operate near a verge of malfunction;
measure an output frequency of the RO; and
compare a value of the output frequency of the RO to a threshold value,
wherein if the value is equal to, or lower than, the threshold value, then the value of the manufactured process variation of the integrated circuit is more toward the SS process corner, and if the output frequency of the ARO is greater than the threshold value, the value of the manufactured process variation of the integrated circuit is more toward the FF process corner.

18. The apparatus of claim 14, wherein the threshold value is a digital value.

19. The apparatus of claim 14, further comprising a mobile device, a music player, a video player, an entertainment unit, a navigation device, a communications device, a tablet, a computer, or a combination thereof, of which the processor is a constituent part.

20. A non-transitory computer-readable medium, comprising:
processor-executable instructions stored thereon configured to cause a processor to identify a process corner of an integrated circuit having a first asymmetrical ring oscillator (ARO1) including pull-up transistors that have a low threshold voltage (LVT) and pull-down transistors that have a regular threshold voltage (RVT), and a second asymmetrical ring oscillator (ARO2) including pull-up transistors that have an RVT and pull-down transistors having an LVT, wherein the processor-executable instructions are configured to cause the processor to:
  initiate applying an ultra-low power supply voltage to the ARO1 and the ARO2, wherein the applied ultra-low power supply voltage causes the integrated circuit to operate near a verge of malfunction;
  initiate measuring an output frequency of the ARO1;
  initiate measuring an output frequency of the ARO2;
  initiate calculating a calculated ratio of the output frequency of the ARO1 and the output frequency of the ARO2; and
  initiate comparing the calculated ratio to a fiduciary ratio, wherein the fiduciary ratio is of the output frequency of the ARO1 and the output frequency of the ARO2 at a typical-typical (TT) process corner, a slow-slow (SS) process corner, or a fast-fast (FF) process corner, and wherein if the calculated ratio is more than a first number of times the fiduciary ratio or less than a second number of times the fiduciary ratio, then the value of a manufactured process variation of the integrated circuit is substantially at an asymmetric process corner.

21. The non-transitory computer-readable medium of claim 20, wherein the ratio of the output frequency of the ARO1 to the output frequency of the ARO2 is a digital value, and the fiduciary ratio is a digital value.

22. The apparatus of claim 20, wherein the processor-executable instructions further include instructions to cause the processor to at least one of:
  initiate comparing the output frequency of the ARO1 to a threshold value, wherein if the output frequency of the ARO1 is less than the threshold value, then the value of the manufactured process variation of the integrated circuit is more toward the SS process corner, and if the output frequency of the ARO1 is greater than the threshold value, the value of the manufactured process variation of the integrated circuit is more toward the FF process corner; and
  initiate comparing the output frequency of the ARO2 to the threshold value, wherein if the output frequency of the ARO2 is less than the threshold value, then the value of the manufactured process variation of the integrated circuit is more toward the SS process corner, and if the output frequency of the ARO2 is greater than the threshold value, the value of the manufactured process variation of the integrated circuit is more toward the FF process corner.

23. The non-transitory computer-readable medium of claim 20, wherein the integrated circuit further includes a symmetrical ring oscillator (RO) including pull-up transistors that have a RVT and pull-down transistors that have an RVT, and the processor-executable instructions further include instructions to cause the processor to:
  initiate applying the ultra-low power supply voltage to the RO, wherein the applied ultra-low power supply voltage causes the integrated circuit to operate near a verge of malfunction;
  initiate measuring an output frequency of the RO; and
  initiate comparing a value of the output frequency of the RO a threshold value,
  wherein if the value is equal to, or lower than, the threshold value, then the value of the manufactured process variation of the integrated circuit is more toward the SS process corner, and if the output frequency of the ARO is greater than the threshold value, the value of the manufactured process variation of the integrated circuit is more toward the FF process corner.

24. The non-transitory computer-readable medium of claim 20, wherein the threshold value is a digital value.

25. The non-transitory computer-readable medium of claim 20, further comprising a mobile device, a music player, a video player, an entertainment unit, a navigation device, a communications device, a tablet, a computer, or a combination thereof, with which the computer-readable medium is integrated.

* * * * *